United States Patent
Zhou et al.

(10) Patent No.: US 6,538,900 B2
(45) Date of Patent: Mar. 25, 2003

(54) COMPUTER ENCLOSURE WITH HOLDER BRACKET

(75) Inventors: Jianqing Zhou, Shenzhen (CN); Zigan Zou, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 156 days.

(21) Appl. No.: 09/738,694

(22) Filed: Dec. 15, 2000

(65) Prior Publication Data

US 2002/0039277 A1 Apr. 4, 2002

(30) Foreign Application Priority Data

Sep. 29, 2000 (TW) ........................................ 089216957

(51) Int. Cl.⁷ .................................................. H05K 7/18
(52) U.S. Cl. ...................... 361/796; 361/801; 312/223.2
(58) Field of Search ................................ 361/728–730, 361/752, 829, 683, 796, 798, 801, 802, 758, 759, 684; 312/223.1, 223.2, 265.5, 265.6

(56) References Cited

U.S. PATENT DOCUMENTS

| | | | | |
|---|---|---|---|---|
| 5,420,760 A | * | 5/1995 | Ansell et al. | 174/35 GC |
| 5,640,309 A | * | 6/1997 | Carney et al. | 211/41.1 |
| 6,053,586 A | * | 4/2000 | Cook et al. | 292/146 |
| 6,097,591 A | * | 8/2000 | Ircha | 312/223.2 |
| 6,123,139 A1 | * | 5/2001 | Chen | 312/223.2 |

* cited by examiner

Primary Examiner—Darren Schuberg
Assistant Examiner—Anthony Q. Edwards
(74) Attorney, Agent, or Firm—Wei Te Chung

(57) ABSTRACT

A computer enclosure includes a chassis (40) and a holder bracket (10). A plurality of guideways (48) is defined in the chassis. A rear wall (46) of the chassis includes an opening (51), a plurality of screw holes (59), and a plurality of claws (57). The curvature of each claw is adjustable thereby adjusting engagement between the claw and a slot cover of an expansion card. The holder bracket includes a base (12) and a panel (14) extending perpendicularly from the base. The base forms a plurality of hooks (16) for engaging with the guideways of the chassis. The panel is accommodated at the opening of the chassis. A plurality of through holes (25) is defined in the panel for extension of screws (60) therethrough into the screw holes, to secure the holder bracket to the chassis.

7 Claims, 4 Drawing Sheets

COMPUTER ENCLOSURE WITH HOLDER BRACKET

BACKGROUND OF THE INVENTION

1. FIELD OF THE INVENTION

The present invention relates to a computer enclosure, and particularly to a computer enclosure having a holder bracket for readily assembling expansion cards therein.

2. RELATED ART

As a computer's functions increase, more and more devices and expansion cards are required to be installed in a computer enclosure. These days, a plurality of expansion connectors are mounted on most printed circuit boards. The connectors receive expansion cards, thereby enhancing the computer's functions. The expansion cards may, for example, be sound cards, network cards, SCSI device interface cards, and so on.

Most commonly, an expansion card is secured on a window frame with screws, and the window frame is then attached to a rear panel of a computer enclosure with screws or hooks. However, using multiple screws is complicated and time-consuming. Furthermore, a plurality of screw holes or engaging holes is required to be formed in the window frame. This complicates the manufacturing process, thereby increasing costs.

Examples of conventional computer enclosures are found in Taiwan Patent Applications Nos. 84206442, 86208946, and 82205007, and U.S. Pat. Nos. 5,004,867, and 5,650,922.

SUMMARY OF THE INVENTION

Accordingly, an object of the present invention is to provide a computer enclosure with a holder bracket for readily and securely attaching expansion cards therein.

To achieve the above-mentioned object, the computer enclosure of the present invention comprises a chassis and a holder bracket attached to the chassis. The chassis comprises a bottom wall, a top wall, a rear wall between the bottom wall and the top wall, and a side panel. A plurality of guideways is defined in the chassis. The rear wall defines an opening and a plurality of screw holes adjacent the opening. A vertical flange extending from the rear wall forms a plurality of claws extending into the opening. The curvature of each claw is adjustable thereby adjusting engagement between the claw and a slot cover of an expansion card. The holder bracket comprises a base and a panel. The base forms a plurality of hooks for engaging with the guideways of the chassis. The panel is accommodated at the opening of the chassis. The panel defines a plurality of slots for providing access to expansion cards. An L-profiled flange extends from outer edges of the panel. A plurality of through holes is defined in the flange for extension of screws therethrough into the screw holes, to secure the holder bracket to the chassis.

Other objects, advantages and novel features of the present invention will be drawn from the following detailed embodiment of the present invention with attached drawings, in which:

DESCRIPTION OF THE PREFERRED EMBODIMENT

Figure 1:
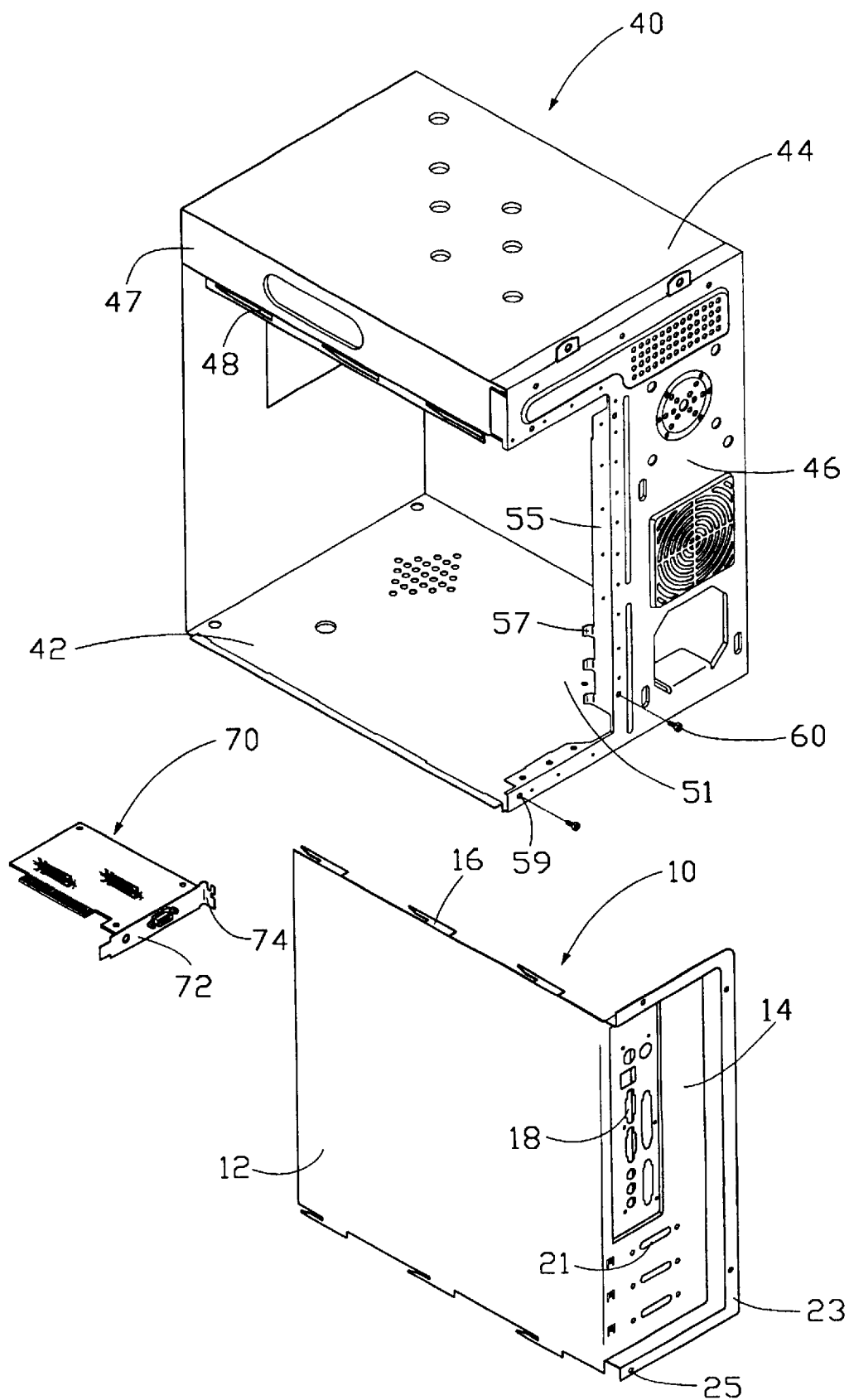
FIG. 1 is an exploded view of a computer enclosure in accordance with the present invention, and an expansion card for attachment thereto.
Figure 2:
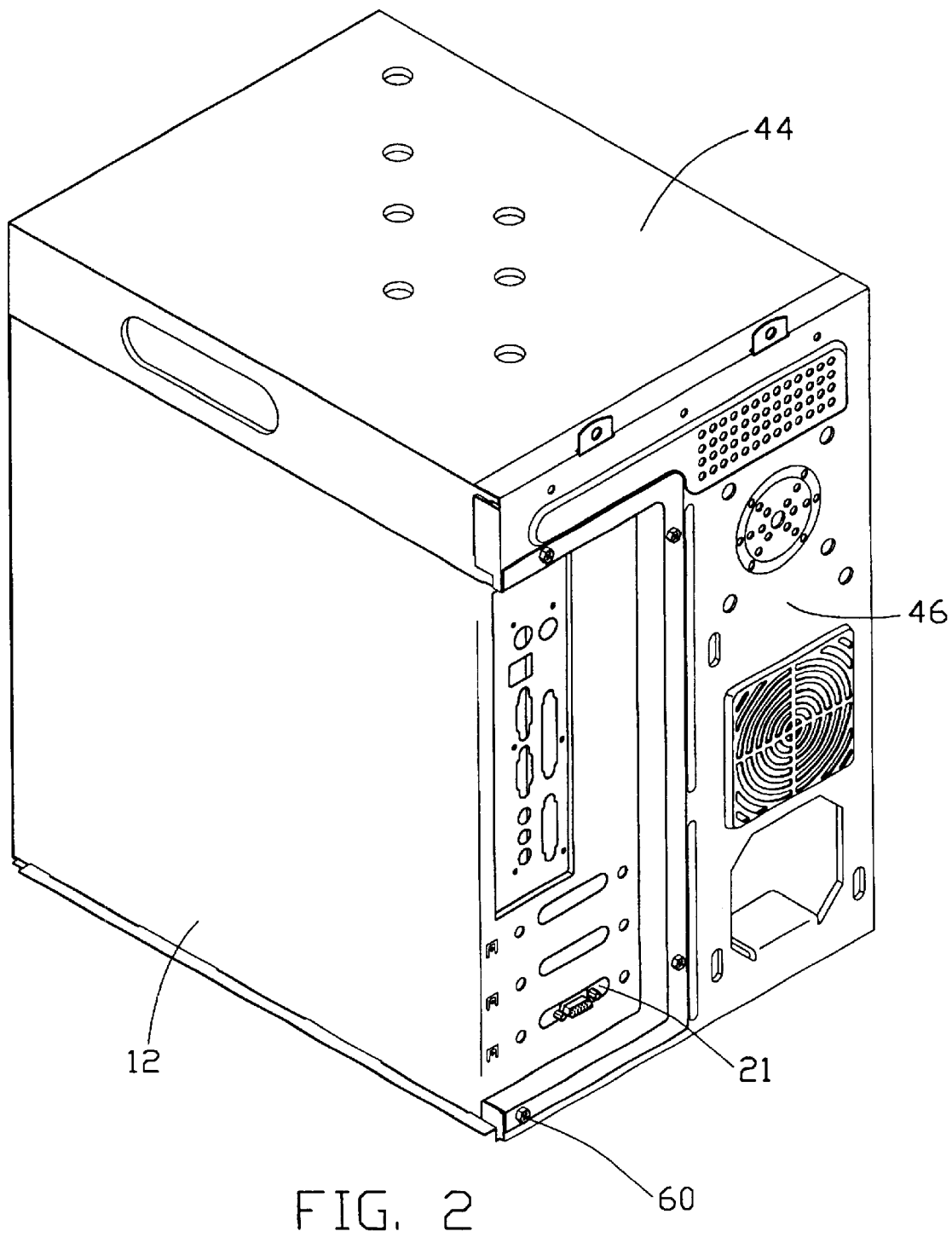
FIG. 2 is an assembled view of FIG. 1.

Referring to FIGS. 1 and 2, a computer enclosure in accordance with the present invention comprises a chassis 40, and a holder bracket 10 for mounting expansion cards 70 to the chassis 40.

Each expansion card 70 has a slot cover 72 attached at one end thereof. A bent portion 74 extends perpendicularly outwardly from one end of the slot cover 72.

The chassis 40 comprises a bottom wall 42, a top wall 44, a rear wall 46 between the top wall 44 and the bottom wall 42, and a side panel 47. The side panel 47 depends from a longitudinal edge of the top wall 44. A plurality of guideways 48 is defined at a bottom edge of the side panel 47, and at an edge of the bottom wall 42 directly opposite the side panel 47. A rectangular opening 51 is defined in the rear wall 46, diagonally adjacent the side panel 47. A vertical flange 55 extends perpendicularly inwardly from a central vertical edge of the rear wall 46 which forms a limit of the opening 51. A plurality of claws 57 is formed at a bottom portion of a distal edge of the flange 55, for engaging with bent portions 74 of expansion cards 70. The curvature of the claw 57 is adjustable by using a tool, for adjusting engagement between the claw 57 and the slot cover 72 of the corresponding expansion card 70. The rear wall 46 defines a plurality of screw holes 59 at the central vertical edge thereof and at top and bottom edges thereof which form limits of the opening 51. Screws 60 are engagable in the screw holes 59.

The holder bracket 10 comprises a base 12, and a panel 14 extending perpendicularly from the base 12. A plurality of hooks 16 is formed at top and bottom edges of the base 12, for engaging with the guideways 48 of the chassis 40. The panel 14 is dimensioned to correspond to the opening 51 of the chassis 40. A plurality of apertures 18 is defined in the panel 14, for providing access to connectors (not shown) of a printed circuit board (not shown). A plurality of parallel slots 21 is defined in the panel 14 for providing access to connectors (not labeled) of expansion cards 70. An L-profiled flange 23 extends perpendicularly outwardly from combined top, bottom and one side edges of the panel 14. A plurality of through holes 25 is defined in the flange 23, corresponding to the screw holes 59 of the chassis 40.

Figure 3:
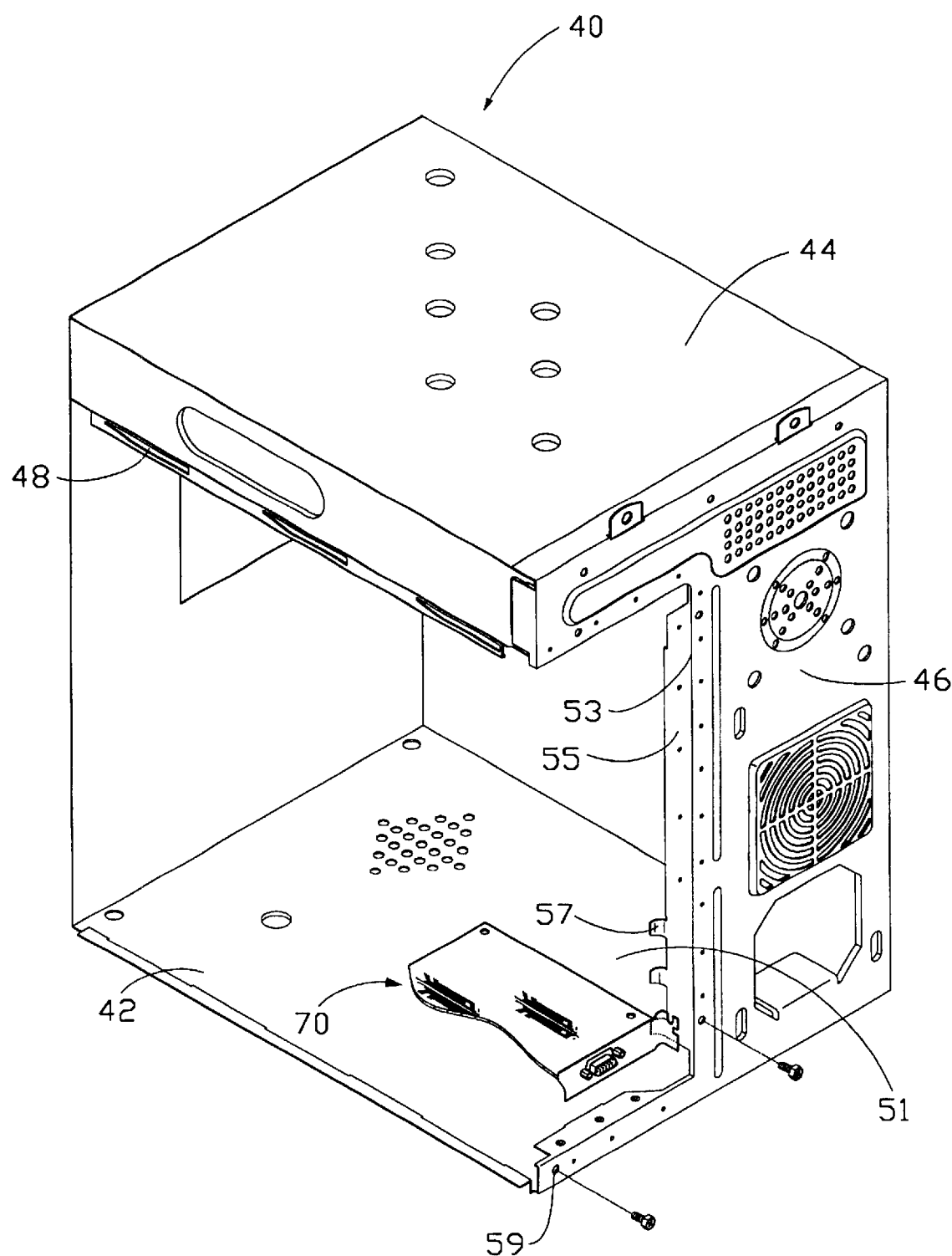
FIG. 3 is similar to FIG. 2, but not showing a holder bracket of FIG. 2.
Figure 4:
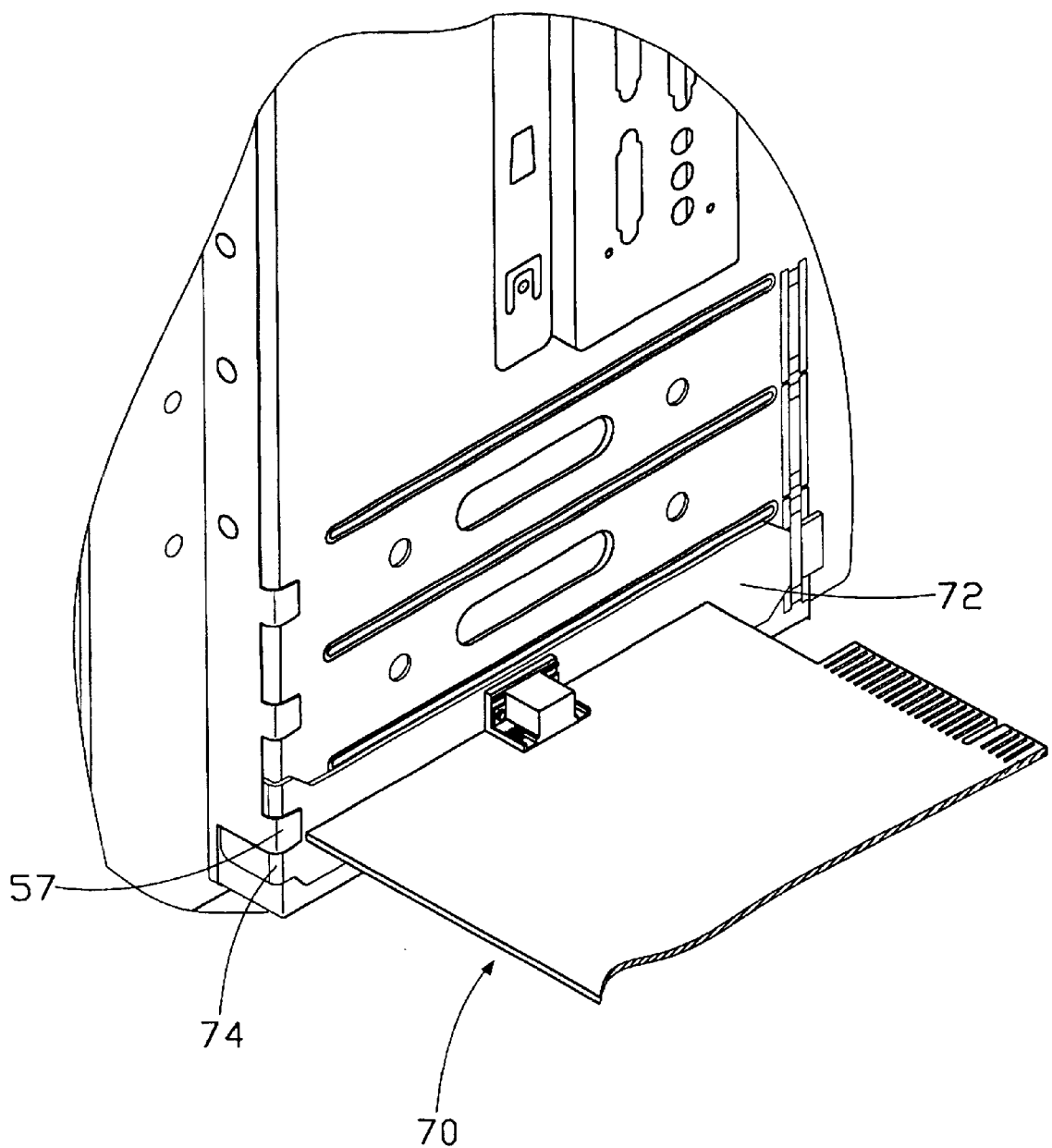
FIG. 4 is a close-up perspective view of the expansion card attached to the computer enclosure.

Referring also to FIGS. 3 and 4, in assembly, a printed circuit board (not shown) with a number of expansion cards 70 inserted thereon is attached to the holder bracket 10. The bracket 10 with the printed circuit board (not shown) attached thereon is attached to the chassis 40. The panel 14 is accommodated at the opening 51 of the chassis 40. The hooks 16 of the holder bracket 10 engage with the guideways 48 of the chassis 40. Each claw 57 of the chassis 40 abuts the bent portion 74 of each expansion card 70 (see FIG. 4). The screws 60 are inserted into the through holes 25 of the holder bracket 10 to engage with the screw holes 59 of the chassis 40. Thus expansion cards 70 are firmly secured to the chassis 40.

In the computer enclosure of the present invention, each expansion card 70 is installed in the holder bracket 10 without screws. This reduces the number of the screws needed for the assembly, thereby lowering manufacturing costs. Because the curvature of the claws 57 is adjustable, the force exerted on the bent portion 74 of each expansion card 70 is adjustable. Each expansion card 70 is thereby firmly secured in the chassis 40.

It is understood that the invention may be embodied in other forms without departing from the spirit thereof. Thus, the present example and embodiment are to be considered in all respects as illustrative and not restrictive, and the invention is not to be limited to the details given herein.

What is claimed is:

1. A computer enclosure comprising:
   a holder bracket having a base adapted to receive a printed circuit board which has at least one expansion card with a slot cove, and a panel extending perpendicularly from the base; and
   a chassis having a rear wall, the rear wall comprising an opening for receiving the panel of the holder bracket, and at least one claw adapted to engagingly abut the slot cover of the corresponding expansion card.

2. The computer enclosure as described in claim 1, wherein the rear wall of the chassis defines at least one screw hole, and the panel of the bracket defines at least one through hole for extension of at least one screw to secure the bracket to the chassis.

3. The computer enclosure as described in claim 1, wherein the curvature of each claw is adjustable thereby adjusting engagement between the claw and the slot cover of the corresponding expansion card.

4. The computer enclosure as described in claim 1, wherein the rear wall of the chassis has a vertical flange extending therefrom adjacent the opening, and wherein the at least one claw is formed at the flange.

5. The computer enclosure as described in claim 1, wherein the panel of the holder bracket defines at least one slot for providing access to the corresponding expansion card.

6. The computer enclosure as described in claim 1, wherein the base of the holder bracket has at least one hook, and the chassis defines at least one guideway for engaging with the at least one hook.

7. A computer enclosure assembly comprising:
   a chassis including a rear wall with a rectangular opening therein; and
   an L-shaped holder bracket including a base adapted to install a printed circuit board thereon, and a panel with a plurality of apertures for access of some internal connectors, and with a plurality of slots for access of other internal connectors mounted on expansion cards; wherein
   each of said expansion cards includes a slot cover with two ends thereof, of which one end is retained by the panel and the other end is retained between the panel and the rear wall.

* * * * *